(12) United States Patent
Lin et al.

(10) Patent No.: US 7,560,990 B2
(45) Date of Patent: Jul. 14, 2009

(54) LOW NOISE AMPLIFIER AND LOW NOISE AMPLIFYING METHOD

(75) Inventors: Ying-Yao Lin, Hsin-Chu Hsien (TW); Chao-Cheng Lee, Hsin-Chu (TW); Ying-Hsi Lin, Hsin-Chu (TW)

(73) Assignee: Realtek Semiconductor Corp., HsinChu (TW)

( * ) Notice: Subject to any disclaimer, the term of this patent is extended or adjusted under 35 U.S.C. 154(b) by 66 days.

(21) Appl. No.: 11/687,671

(22) Filed: Mar. 19, 2007

(65) Prior Publication Data

US 2007/0229164 A1    Oct. 4, 2007

(30) Foreign Application Priority Data

Apr. 4, 2006    (TW) .............................. 95111973 A

(51) Int. Cl.
*H03G 3/10*    (2006.01)
(52) U.S. Cl. ..................... 330/285; 330/296; 330/278
(58) Field of Classification Search ................. 330/285, 330/296, 278
See application file for complete search history.

(56) References Cited

U.S. PATENT DOCUMENTS

| 6,084,472 | A | * | 7/2000 | Gilbert ........................ 330/254 |
| 6,175,274 | B1 | | 1/2001 | Groe |
| 6,181,206 | B1 | | 1/2001 | Palmisano |
| 6,259,224 | B1 | | 7/2001 | Smith |
| 6,400,224 | B2 | | 6/2002 | Gharpurey |
| 6,873,211 | B1 | * | 3/2005 | Thompson et al. .......... 330/285 |
| 7,245,890 | B2 | * | 7/2007 | Kumagawa et al. ......... 455/130 |
| 7,358,816 | B2 | * | 4/2008 | Ryu et al. .................... 330/285 |
| 7,400,192 | B2 | * | 7/2008 | Cho et al. ...................... 330/51 |
| 2003/0151461 | A1 | | 8/2003 | Arayashiki |
| 2003/0218505 | A1 | | 11/2003 | Nakamura |
| 2005/0110569 | A1 | | 5/2005 | Bhattacharjee |

FOREIGN PATENT DOCUMENTS

| JP | 9-246886 | 9/1997 |
| WO | 00/76061 A1 | 12/2000 |

OTHER PUBLICATIONS

H. Darabi, et al., "A Fully integrated SoC for 802.11b in 0.18um CMOS", ISSCC 2005/Session 5/WLAN Transceivers/5.3, pp. 96-97 & 586, 2005 IEEE Internation Solid-State Circuits Conference.

* cited by examiner

*Primary Examiner*—Patricia Nguyen
(74) *Attorney, Agent, or Firm*—Winston Hsu

(57) ABSTRACT

A low noise amplifier for operating in response to different gain modes is disclosed. The low noise amplifier includes a voltage adjusting circuit, which provides a first bias voltage at a first gain mode and provides a second bias voltage at a second gain mode, where the second bias voltage is different from the first bias voltage; and an amplifying circuit coupled to the voltage adjusting circuit, for providing a first transfer characteristic according to the first bias voltage during the first gain mode in order to amplify an input signal to generate an output signal, and for providing a second transfer characteristic according to the second bias voltage during the second gain mode in order to amplify the input signal to generate the output signal.

10 Claims, 5 Drawing Sheets

LOW NOISE AMPLIFIER AND LOW NOISE AMPLIFYING METHOD

BACKGROUND OF THE INVENTION

1. Field of the Invention

The invention relates to a low noise amplifier, and more particularly, to a dynamically adjusting a bias voltage low noise amplifier when switching gain modes to improve linearity.

2. Description of the Prior Art

A low noise amplifier is the first amplifying circuit in the front-end receiver of the wireless communication system. Normally, any noise that exists in the transmitting channel, like air, will always contaminate a transmitting signal. When the receiver receives the transmitting signal, the low noise amplifier provides a gain to amplify the received signal to an acceptable power, but also to attenuate the noise in the transmitting signal simultaneously. Furthermore, regarding a receiver being located closest to a base station of the wireless communication system, the gain of the low noise amplifier should be adjust to a rather low gain to prevent the receiver from entering a saturated situation. The saturated situation can result because the amplitude of the transmitting signal is higher corresponding in relation to the closeness of the base station; in other words, the power of the received signal is higher.

Therefore, a rather low gain of the low noise amplifier will guarantee a normal operation of the receiver in the case where the receiver and the base station are close to each other. Therefore, most of the low noise amplifiers are capable to adjusting the gain according to the power of the received signal. Additionally, certain other low noise amplifiers are capable of switching between a high gain operating mode and a low gain operating mode as needed based on said distance conditions.

In reality, there are two problems that will result due to the above-mentioned low noise amplifier strategies. Firstly, when the low noise amplifier is switching from the high gain operating mode into the low gain operating mode, in other words, that is when the amplitude of the received signal is high, the low noise amplifier is not able to provide an acceptable linearity to the received signal simultaneously and this will consequently cause the received signal to be different from the transmitting signal. Secondly, when the low noise amplifier is switching between a high gain operating mode and a low gain operating mode, the signal path of the received signal will probably change the equivalent circuit of the low noise amplifier and the stable condition of the circuit of the low noise amplifier. Therefore, an oscillation may result.

Please refer to FIG. 1. FIG. 1 illustrates a diagram of a switching gain mode low noise amplifier 100 of the prior art. The configuration of the low noise amplifier 100 is a single-end-input differential-output configuration, wherein the input signal $LNA_{IN}$ at the single-end-input is transformed into a differential input signal. The differential input signal is then amplified by a two stage amplifier to generate a differential output signal; wherein the second stage 104 is an adjustable gain output stage. The control signal $G_0$, $G_0B$ (i.e., an inverse signal of $G_0$), $G_2$, $G_2B$ (i.e., an inverse signal of $G_2$) control the status of conducting/non-conducting of the transistor in the second stage 104 to adjust the gain of the low noise amplifier 100. Accordingly, the low noise amplifier is capable to switching between the high gain operating mode and the low gain operating mode. However, the switching gain low noise amplifier of the prior art has not overcome the above-mentioned linearity problems, furthermore, the embedded transformer 102 increases the chip area of the prior art receiver. Additionally, the embedded transformer 102 also causes degradation to the input signal.

Please refer to FIG. 2. FIG. 2 illustrates a diagram of another switching gain mode low noise amplifier 200 of the prior art. The configuration of the low noise amplifier 200 is a single-input/single-output configuration. The low noise amplifier 200 includes a first input stage 202, a second gain stage 204, and a switching circuit 206. According to FIG. 2, the signal path of the high gain operating mode is different from the signal path of the low gain operating mode in the low noise amplifier 200 in which the oscillation phenomenon may occur. On the other hand, when the low noise amplifier 200 is switching between the high gain operating mode and the low gain operating mode, the condition of input matching of the input impedance is easily changed and this will cause the input signal to be reflected from the input of the low noise amplifier 200. Please refer to the U.S. Pat. No. 6,175,274, for the corresponding technique.

SUMMARY OF THE INVENTION

It is therefore one of the objectives of the present invention to provide a low noise amplifier and method thereof to solve the above-mentioned problems.

Briefly described, the present invention discloses a low noise amplifier, the low noise amplifier comprises: a voltage adjusting circuit for providing a first bias voltage at a first gain mode and providing a second bias voltage at a second gain mode, where the second bias voltage is different from the first bias voltage; and an amplifying circuit coupled to the voltage adjusting circuit for determining a first transfer characteristic according to the first bias voltage and thereby amplifying an input signal to generate an output signal according to the first transfer characteristic, and for determining a second transfer characteristic according to the second bias voltage and thereby amplifying the input signal to generate the output signal according to the second transfer characteristic.

The present invention discloses a method of low noise amplifying, the method comprises: providing a first bias voltage at a first gain mode and providing a second bias voltage at a second gain mode, where the second bias voltage is different from the first bias voltage; and determining a first transfer characteristic according to the first bias voltage and thereby amplifying an input signal to generate an output signal according to the first transfer characteristic, and for determining a second transfer characteristic according to the second bias voltage and thereby amplifying the input signal to generate the output signal according to the second transfer characteristic.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
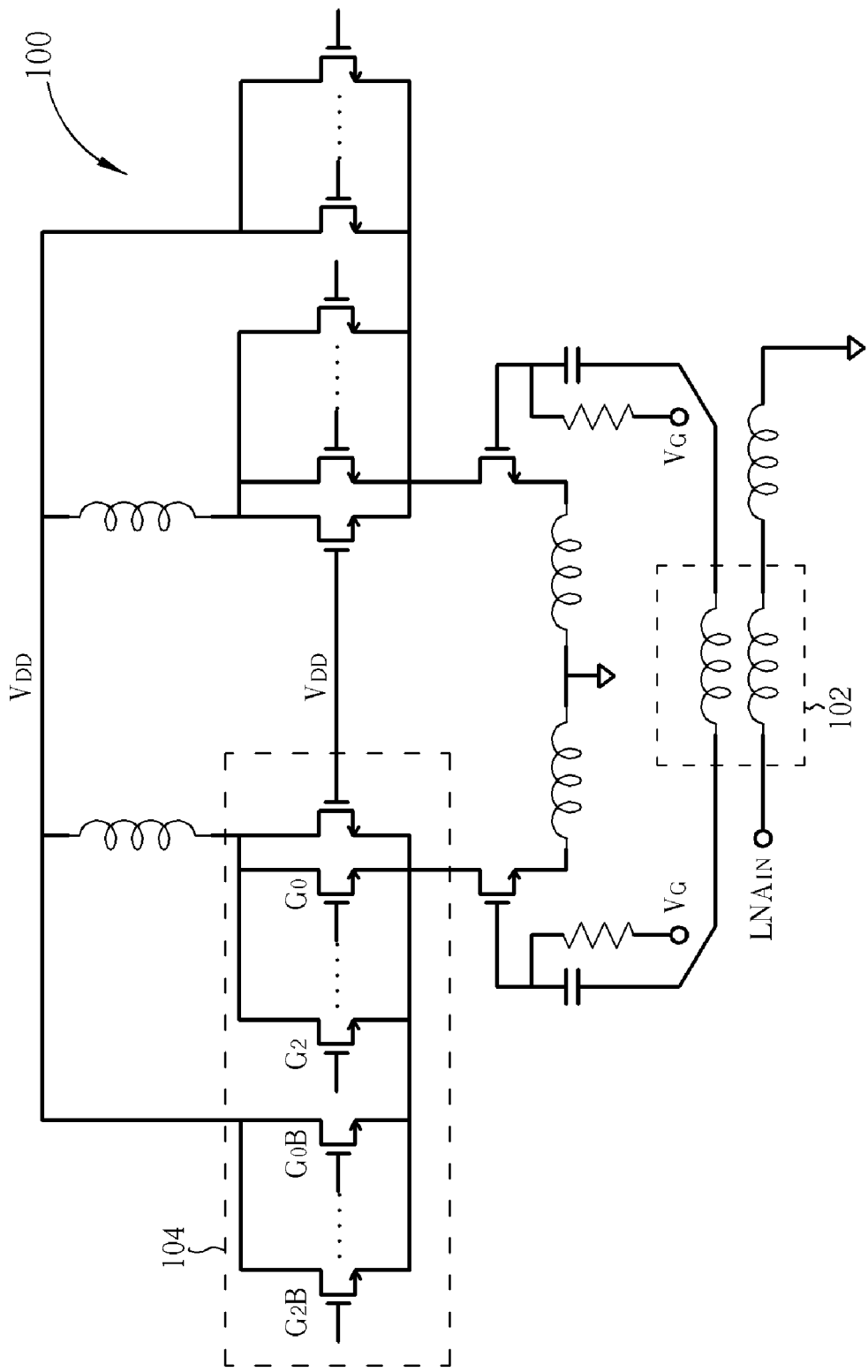
FIG. 1 is a diagram illustrating a switching gain mode low noise amplifier according to the prior art.
Figure 2:
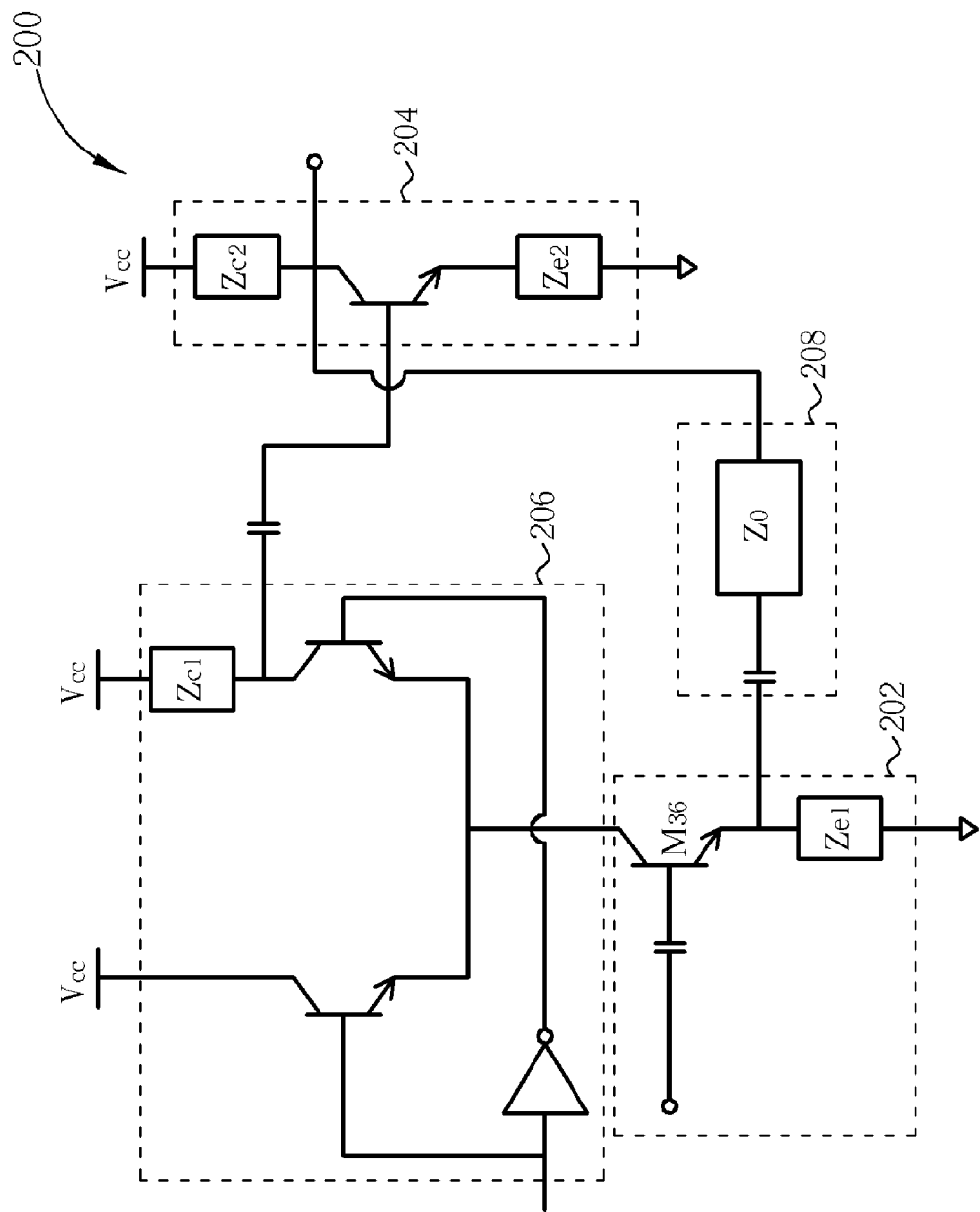
FIG. 2 is a diagram illustrating another switching gain mode low noise amplifier according to the prior art.
Figure 3:
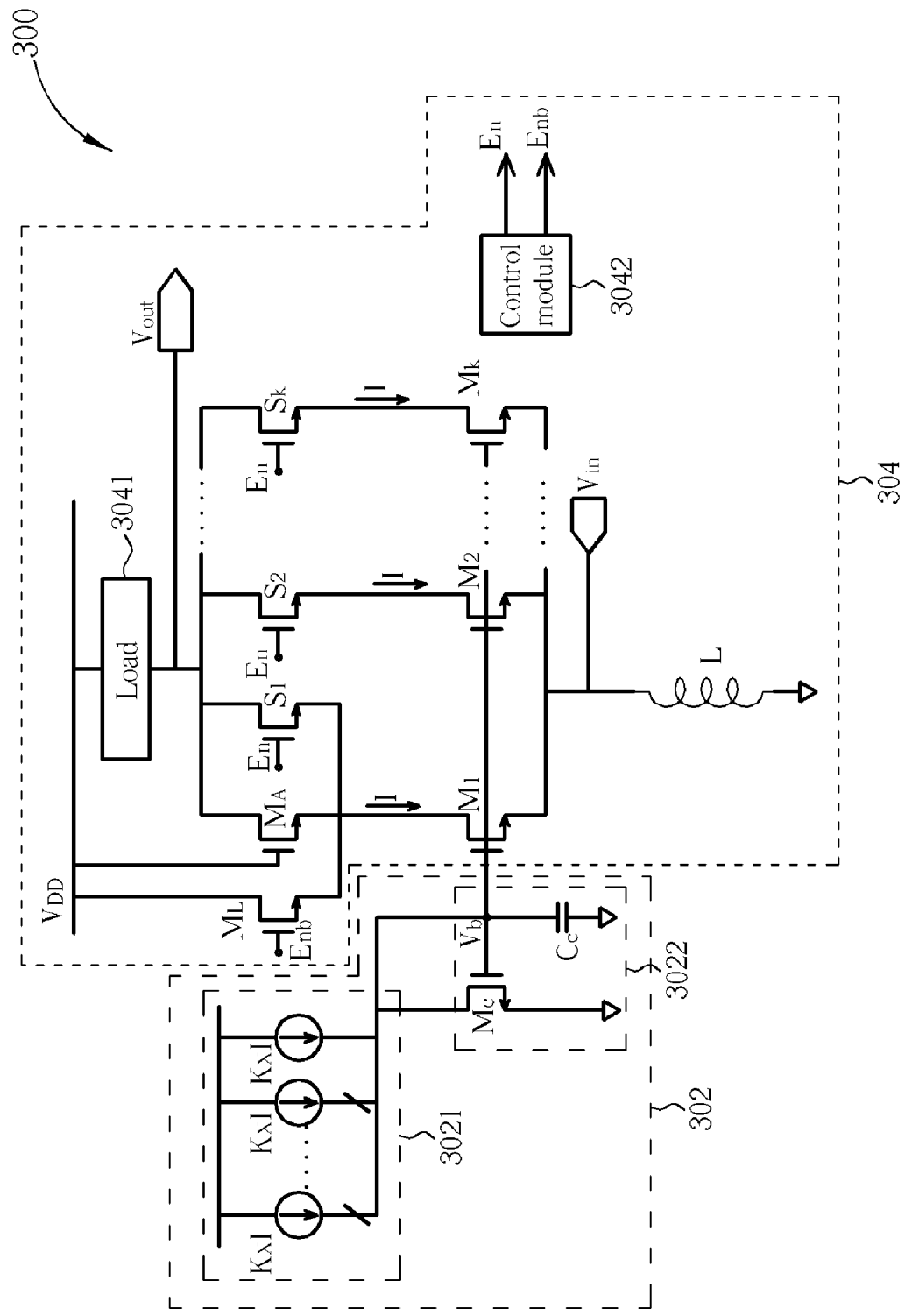
FIG. 3 is a diagram illustrating a low noise amplifier operating in a high operating gain mode according to an embodiment of the present invention.

Please refer to FIG. 3. FIG. 3 illustrates a diagram of a low noise amplifier 300 operating at a high operating gain mode according to an embodiment of the present invention. The low noise amplifier 300 comprises a voltage adjusting circuit 302, and an amplifying circuit 304 coupled to the voltage adjusting circuit 302. In this embodiment of the present invention, when the low noise amplifier 300 receives a signal that has an amplitude higher that a first predetermined value, the voltage adjusting circuit 302 operates in a low operating gain mode and provides a low biasing voltage to the amplifying circuit 304; and when low noise amplifier 300 receives a signal that has the amplitude smaller that a second predetermined value, the voltage adjusting circuit 302 operates in a high operating gain mode and provides a high biasing voltage to the amplifying circuit 304. On the other hand, when the amplifying circuit 304 operates in the low operating gain mode, the amplifying circuit 304 provides a first transfer characteristic to amplify the signal according to the low biasing voltage for generating a low noise output signal; and when the amplifying circuit 304 operates in the high operating gain mode, the amplifying circuit 304 provides a second transfer characteristic to amplify the signal according to the high biasing voltage for generating the low noise output signal, wherein the first transfer characteristic is different with the second transfer characteristic. In this embodiment, the first and second transfer characteristics are linear.

Please refer to FIG. 3. FIG. 3 is a diagram illustrating a low noise amplifier operating in a high operating gain mode according to an embodiment of the present invention. The voltage adjusting circuit 302 comprises a controllable current source 3021, and a current to voltage converting module 3022 coupled to the controllable current source 3021. The controllable current source 3021 comprises K switching DC current sources $DC_1$ through $DC_K$, each switching DC current source provides K*I amperes (I) of current, and the K switching DC current sources $DC_1$ through $DC_K$ are connected in parallel with each other and have a common connecting node which is coupled to the current to voltage converting module 3022, wherein the current to voltage converting module 3022 comprises a transistor $M_C$. Please note that, in this embodiment of the present invention, the aspect ratio (W/L) of the transistor $M_C$ is adjustable, and the adjusting technique is well-known to those persons having average skill in this art and therefore any further description herein is omitted for the sake of brevity. The current to voltage converting module 3022 further comprises a capacitor $C_C$ coupled to a gate terminal the transistor $M_C$, wherein the voltage of the gate terminal transistor $M_C$ corresponds to a voltage $V_b$. The amplifying circuit 304 comprises a load 3041, K current path transistors $M_1$ through $M_K$ (Please note, in this embodiment of the present invention, each aspect ratio of the current path transistor $M_1$ through $M_K$ is W/L, but this is not a limitation of the present invention, it is merely an embodiment), K high operating gain transistor switches $S_1$ through $S_K$, a low operating gain transistor switch $M_L$, and a adjusting transistor $M_A$, wherein the K current path transistors $M_1$ through $M_K$ and the transistor $M_C$ form a configuration of current mirror as shown in FIG. 3. The K high operating gain transistor switches $S_1$ through $S_K$, the low operating gain transistor switch $M_L$, and the adjusting transistor $M_A$ form a configuration of the amplifying circuit 304 with the K current path transistors $M_1$ through $M_K$, respectively. Furthermore, an input terminal $V_{in}$ is coupled to an inductance device L and a common connecting node of the K current path transistors $M_1$ through $M_K$; and an output terminal $V_{out}$ is coupled to a terminal of the load 3041. The present embodiment of the present invention further comprises a control module 3042 coupled to K high operating gain transistor switches $S_1$ through $S_K$ and the gate terminal of the low operating gain transistor switch $M_L$ for generating a control signal $E_n$ (i.e., a low logical level) and a control signal $E_{nb}$ (i.e., a high logical level).

Please continue to refer to FIG. 3. When the low noise amplifier 300 according to this embodiment of the present invention operates in the high operating gain mode, the amplitude of the input signal that is received by the input terminal Vin is smaller than the second predetermined value, that is the input signal is a low power signal; therefore, the low noise amplifier 300 should be operated in the high operating gain mode for linearly amplifying the input signal to the output terminal $V_{out}$. Therefore, firstly, the controllable current source 3021 turns on the $k^{th}$ switching DC current source $DC_K$, and turns off the 1 through $(K-1)^{th}$ switching DC current sources $DC_1$ through $DC_{K-1}$; therefore only K*I amperes of current flow through the transistor $M_C$. Simultaneously, the control module 3042 turns on the K high operating gain transistor switches $S_1$ through $S_K$ via the control signal $E_n$ (i.e., the low logical level), and turns off the low operating gain transistor switch $M_L$ via the other control signal $E_{nb}$ (i.e., the high logical level). Furthermore, the aspect ratio of the transistor $M_C$ is set to be K*(W/L) in the high operating gain mode, and because the transistor $M_C$ and the K current path transistors $M_1$ through $M_K$ consist of the same gate terminal voltage $V_b$, therefore the current K*I that is being provided by the $k^{th}$ switching DC current source $DC_k$ discharges the capacitor $C_C$ to decrease the voltage $V_b$. At the same time, each current that flows through the K current path transistors $M_1$ through $M_K$ is I A (Amperes). According to the disclosed operation, when the low noise amplifier 300 operates in the high gain operating mode, the voltage $V_b$ is also decreased and consequently causes the voltage between the gate terminal and source terminal of the K current path transistors $M_1$ through $M_K$ to decrease. This will exactly conform to the requirement of the waveform completeness of the input signal with the low power to avoid any waveform distortion. Furthermore, all of the K high operating gain transistor switches $S_1$ through $S_K$ are turned on at this moment therefore causing the current flow through the load 3041 to be increased. Accordingly, a high transfer characteristic between the input signal and the output signal is provided. From the above-mentioned operation, the present invention discloses that when the low noise amplifier 300 receives an input signal with a power smaller than the second predetermined value, the embodiment is able to provide a high gain for the input signal and a high linearity output to satisfy the system requirements.

Moreover, in order to satisfy the requirement of impedance matching at the input terminal and the output terminal of the previous stage, for the example, an input impedance of 50 Ohm at the input terminal, the transconductance of the input terminal of the low noise amplifier 300 is designed to be 20 mS. According to the prior art, each transconductance gm of the K current path transistors $M_1$ through $M_K$:

$$Gm=2*I/(V_{gs}-V_t)$$

wherein I is the current flow through each of the K current path transistors $M_1$ through $M_K$, $V_{gs}$ is the voltage between the gate terminal and the source terminal of each of the K current path transistors $M_1$ through $M_K$, $V_t$ is the threshold voltage of each of the K current path transistors $M_1$ through $M_K$. Because the K current path transistors $M_1$ through $M_K$ are connected in parallel with each other, thus the input transconductance of the input terminal $V_{in}$ is the total transconductance $gm_1$ through $gm_k$ of each of the K current path transistors $M_1$ through $M_K$; therefore, when high operating gain mode, the input transconductance $GM_1$ from the input terminal of the embodiment is designed to be:

$$gm_1+gm_2, \ldots, gm_k=2*K*I/(V_{gs}-V_t)=20 \text{ mS}$$

to obtain an excellent impedance matching.

Figure 4:
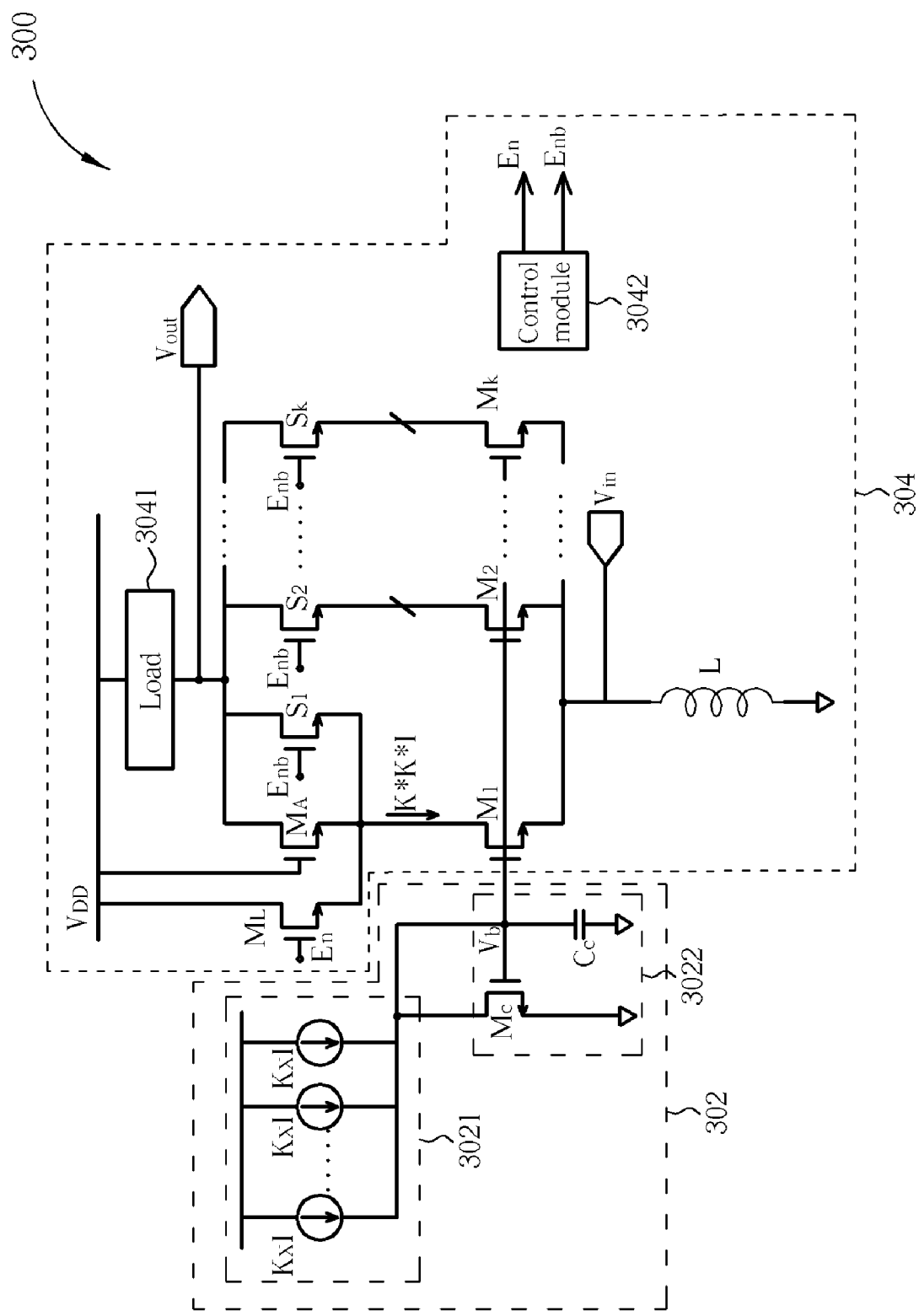
FIG. 4 is a diagram illustrating a low noise amplifier operating in a low operating gain mode according to the embodiment of the present invention.

Please refer to FIG. 4. FIG. 4 illustrates a diagram of low noise amplifier 300 operating in low operating gain mode according to the embodiment of the present invention. Firstly, the controllable current source 3021 turns on all of the K switching DC current sources $DC_1$ through $DC_K$, therefore a total of K*K*I amperes of current flows through the transistor $M_C$. Simultaneously, the control module 3042 turns off the K high operating gain transistor switches $S_1$ through $S_K$ and turns on the low operating gain transistor switch $M_L$. Furthermore, the aspect ratio of the transistor $M_C$ is set to be W/L in the low operating gain mode, and because the transistor $M_C$ and the K current path transistors $M_1$ through $M_K$ consist of the same gate terminal voltage $V_b$, therefore the current K*K*I that provided by the K switching DC current sources $DC_1$ through $DC_K$ charges the capacitor $C_C$ to increase the voltage $V_b$. Therefore, the current K*K*I only flows through the first current path transistor $M_1$. According to the disclosed operation, when the low noise amplifier 300 operates in the low gain operating mode, the voltage $V_b$ is also increased and consequently causes the voltage between the gate terminal and source terminal of the first current path transistors $M_1$ increase. This will exactly conform to the requirement of the waveform completeness of the input signal with high power to avoid the waveform distortion. Furthermore, all of the K high operating gain transistor switches $S_1$ through $S_K$ are turn off at this moment to therefore causing the current flow through the load 3041 decreased. Accordingly, a low transfer characteristic between the input signal and the output signal is provided. Furthermore, the current flowed through the load 3041 can be adjusted via the adjusting of the aspect ratio of the adjusting transistor $M_A$. From the above-mentioned operation, the present invention disclosed that when low noise amplifier 300 receives an input signal with high power, the embodiment is able to provide a low gain for the input signal and high linearity output to satisfy the system requirement.

Moreover, as mentioned in above, when the low noise amplifier 300 operates in the high operating gain mode, the transconductance $GM_1$ of the input terminal is: $gm_1+gm_2, \ldots, gm_k=2*K*I/(V_{gs}-V_t)=20$ mS.

When the low noise amplifier 300 operates in the low operating gain mode, only the first current path transistor $M_1$ is conducted; therefore, the input transconductance of the input terminal $V_{in}$ is $2K*K*I/(V_{gs1}-V_t)$, in which $V_{gs}=I^{1/2}+V_t$, and $V_{gs1}=K*I^{1/2}+V_t$, and it can be obtained that $2K*K*I/(V_{gs1}-V_t)=GM_1$. Accordingly, the low noise amplifier 300 can obtain an excellent input impedance matching when it operates in the low operating gain mode. In other words, regardless of what mode the low noise amplifier 300 operates in, high operating gain mode or low operating gain mode, the input impedance is not changed, but the linearity of the low noise amplifier 300 at the low operating gain mode is improved.

Figure 5:
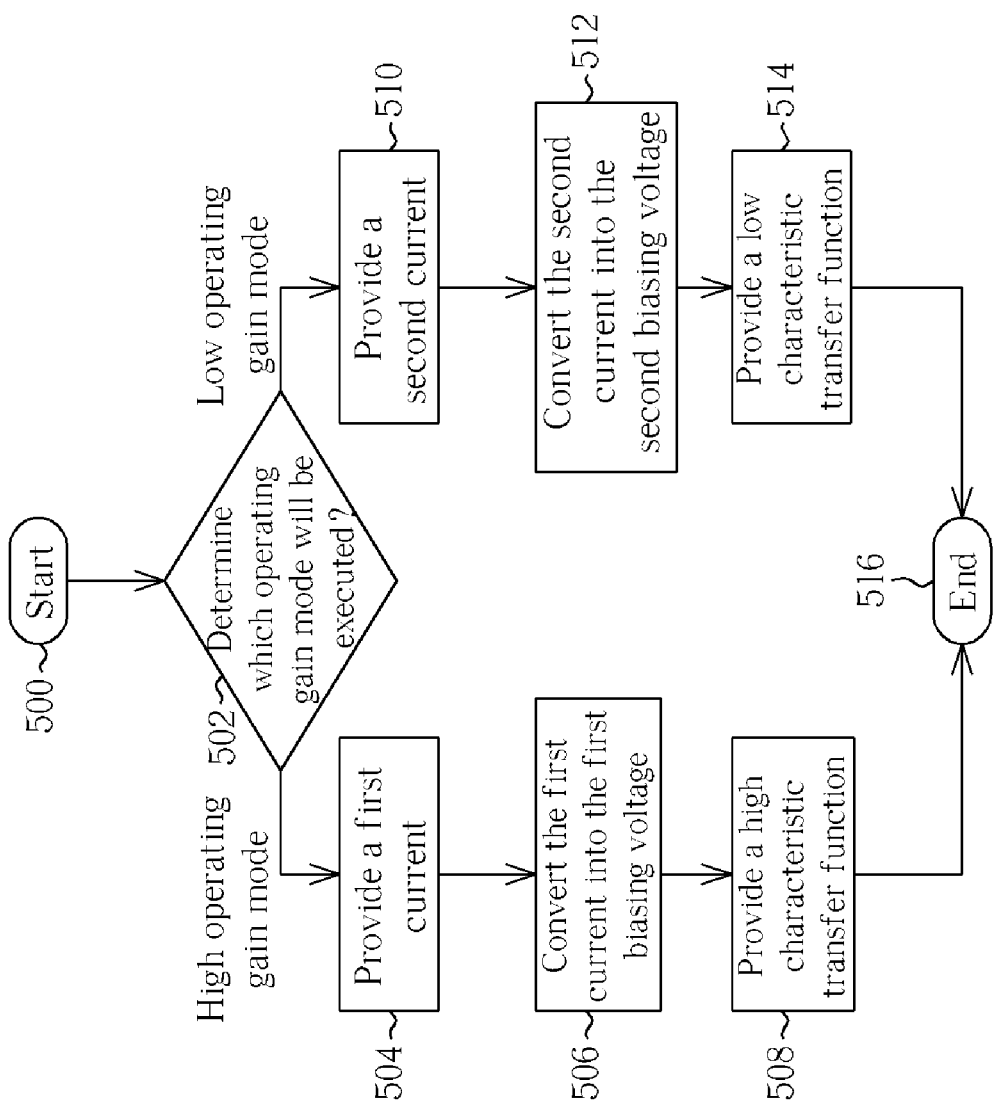
FIG. 5 is a flowchart illustrating a low noise amplifier operating at different operating gain modes according to the embodiment of the present invention shown in FIG. 3.

Please refer to FIG. 5. FIG. 5 is a flowchart illustrating low noise amplifier 300 operating at different operating gain modes according to the embodiment shown in FIG. 3. The steps are as follows:

Step 500: Start;
Step 502: Determine which operating gain mode will be executed? If the high operating gain mode, go to step 504; if the low operating gain mode, go to step 510;
Step 504: Provide a first current;
Step 506: Convert the first current into the first biasing voltage;
Step 508: Provide a high characteristic transfer function to amplify an input signal according to the first biasing voltage to generate an output signal, and then go to step 516;
Step 510: Provide a second current;
Step 512: Convert the second current into the second biasing voltage;
Step 514: Provide a low characteristic transfer function to amplify an input signal according to the second biasing voltage to generate an output signal;
Step 516: End.

Specifically, the first biasing voltage is lower than the second biasing voltage. Step 508 and step 514 comprises providing an amplifying circuit, and utilizing the amplifying circuit to amplify the input signal to generate the output signal. Step 508 and step 514 further comprises a plurality of first transistors and at least one second transistor, each of the first transistor and the current to voltage converting module form a current mirror configuration, and the source terminal of each of the first transistor coupled to an input terminal of the low noise amplifier 300 to receive the input signal. Furthermore, the drain terminal of the second transistor coupled to the load. Step 508 controls the first transistor to connect to the load, and step 514 controls the first transistor to disconnect to the load. Accordingly, the low noise amplifier 300 is able to provide a transconductance to the input signal when operated in the high operating gain mode substantially equal to a transconductance to the input signal when operated in the low operating gain mode.

In an other embodiment according to the present invention, a low noise amplifier comprises a voltage adjusting circuit and a amplifying circuit. The primary difference from this embodiment and said earlier embodiments is related to the low noise amplifier and the previously disclosed low noise amplifier. Specifically, the voltage adjusting circuit comprises a fixed current source for providing a reference current; and a controllable current to voltage converting module coupled to the fixed current source for converting the reference current into the first biasing voltage during the first gain mode, and converting the reference current into the second biasing voltage during the second gain mode. An embodiment of the above-mentioned controllable current to voltage converting module can be an adjusting impedance device, the adjusting impedance device has an impedance value of the first gain mode that is different with an impedance value of the second gain mode. Furthermore, the current that flows through the load can be adjusted by the aspect ratio of transistor $M_A$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A low noise amplifier for operating in response to one of a first gain mode and a second gain mode, comprising:
   a voltage adjusting circuit, for providing a first bias voltage during the first gain mode and providing a second bias voltage during the second gain mode, where the second bias voltage is different from the first bias voltage; and an amplifying circuit, coupled to the voltage adjusting circuit, for determining a first transfer characteristic according to the first bias voltage and thereby amplifying an input signal to generate an output signal according to the first transfer characteristic, and for determining a second transfer characteristic according to the second bias voltage and thereby amplifying the input signal to generate the output signal according to the second transfer characteristic, and the amplifying circuit comprising:

a load;

a plurality of first transistors and at least one second transistor, wherein each of the first transistors and the second transistor has a first node coupled to the load for generating the output signal, a second node coupled to the input signal for receiving the input signal and a third node coupled to the voltage adjusting circuit for receiving the first bias voltage during the first gain mode and receiving the second bias voltage during the second gain mode;

a plurality of first switching devices, coupled between the first nodes of the first transistors and the load respectively, wherein each of the first switching devices controls its connected first transistor being coupled to or decoupled to the load; and a controlling module, coupled to the first switching devices, for controlling an on/off state of each of the first switching devices with respect to the first gain mode and the second gain mode.

2. The low noise amplifier of claim 1, wherein the voltage adjusting circuit comprises:

a controllable current source, for providing a first current during the first gain mode and providing a second current during the second gain mode, where the second current is different from the first current; and a current to voltage converting module, coupled to the controllable current source, for converting the first current into the first bias voltage, and converting the second current into the second bias voltage.

3. The low noise amplifier of claim 1, wherein the amplifying circuit further comprises:

a second switching device, coupled to the controlling module and coupled between the first node of the second transistor and a power source, for controlling the second transistor being coupled to or decoupled to the power source under the control of the controlling module.

4. The low noise amplifier of claim 1, wherein the amplifying circuit further comprises:

a third transistor, coupled between the load and the first node of the second transistor, for controlling current flowing through the load.

5. The low noise amplifier of claim 4, wherein an aspect ratio of the third transistor is adjustable, and the current flowing through the load is in proportion to the aspect ratio of the third transistor.

6. The low noise amplifier of claim 1, wherein the voltage adjusting circuit comprises:

a fixed current source for providing a reference current; and a controllable current to voltage converting module, coupled to the fixed current source, for converting the reference current into the first bias voltage, and converting the reference current into the second bias voltage.

7. The low noise amplifier of claim 6, wherein the controllable current to voltage converting module is an adjustable resistance device.

8. The low noise amplifier of claim 1, wherein the voltage adjusting circuit is coupled to the amplifying circuit by utilizing a current mirror configuration.

9. The low noise amplifier of claim 1, wherein the amplifying circuit provides a first transconductance for the input signal during the first gain mode and a second transconductance for the input signal during the second gain mode, the first transconductance is substantially equal to the second transconductance.

10. The low noise amplifier of claim 1, wherein at least one of the first and second characteristics is linear.

* * * * *